(12) United States Patent
Jen et al.

(10) Patent No.: US 11,056,311 B2
(45) Date of Patent: Jul. 6, 2021

(54) TIME-DEPENDENT DEFECT INSPECTION APPARATUS

(71) Applicant: ASML Netherlands B.V., Veldhoven (NL)

(72) Inventors: Chih-Yu Jen, San Jose, CA (US); Long Ma, San Jose, CA (US); Yongjun Wang, Pleasanton, CA (US); Jun Jiang, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/552,991

(22) Filed: Aug. 27, 2019

(65) Prior Publication Data
US 2020/0075287 A1  Mar. 5, 2020

Related U.S. Application Data

(60) Provisional application No. 62/723,995, filed on Aug. 28, 2018.

(51) Int. Cl.
*H01J 37/147* (2006.01)
*H01J 37/26* (2006.01)
(Continued)

(52) U.S. Cl.
CPC ...... *H01J 37/1474* (2013.01); *G01N 21/8851* (2013.01); *G01N 21/9505* (2013.01);
(Continued)

(58) Field of Classification Search
CPC ...... H01J 37/1474; H01J 37/263; H01J 37/30; H01J 37/18; H01J 37/222; H01J 37/28; H01J 37/153; H01J 2237/082; H01J 2237/24564; H01J 2237/2817; H01J 2237/004; H01J 2237/2594; H01J 2237/221; G01N 21/8851; G01N 21/9505; G01N 23/2251; G01N 2223/6116;
(Continued)

(56) References Cited

U.S. PATENT DOCUMENTS 6,353,222 B1  3/2002  Dotan
6,476,388 B1  11/2002  Nakagaki et al.
(Continued)

OTHER PUBLICATIONS

Office Action issued by the Chinese Intellectual Property Office (IPO) in related Application No. 108130570, dated Oct. 14, 2020 (12 pgs.).

*Primary Examiner* — Kiet T Nguyen
(74) *Attorney, Agent, or Firm* — Finnegan, Henderson, Farabow, Garrett & Dunner, LLP

(57) ABSTRACT

An improved charged particle beam inspection apparatus, and more particularly, a particle beam inspection apparatus for detecting a thin device structure defect is disclosed. An improved charged particle beam inspection apparatus may include a charged particle beam source to direct charged particles to a location of a wafer under inspection over a time sequence. The improved charged particle beam apparatus may further include a controller configured to sample multiple images of the area of the wafer at difference times over the time sequence. The multiple images may be compared to detect a voltage contrast difference or changes to identify a thin device structure defect.

14 Claims, 8 Drawing Sheets

(51) Int. Cl.
*H01J 37/30* (2006.01)
*G01N 21/95* (2006.01)
*G01N 21/88* (2006.01)
*H01J 37/153* (2006.01)
*H01J 37/18* (2006.01)

(52) U.S. Cl.
CPC .......... *H01J 37/153* (2013.01); *H01J 37/263* (2013.01); *H01J 37/30* (2013.01); *H01J 37/18* (2013.01); *H01J 2237/082* (2013.01); *H01J 2237/221* (2013.01); *H01J 2237/24564* (2013.01); *H01J 2237/2817* (2013.01)

(58) Field of Classification Search
CPC ..... G01N 2223/425; G01N 2223/3301; G01N 2223/418; G01N 2223/102; G01N 2223/086; H01L 22/12
USPC ......................................... 250/310, 306, 307
See application file for complete search history.

(56) References Cited

U.S. PATENT DOCUMENTS

| | | | |
|---|---|---|---|
| 7,453,274 | B1 | 11/2008 | Zhong et al. |
| 8,748,815 | B2 | 6/2014 | Zhao et al. |
| 8,759,762 | B2 | 6/2014 | Xiao et al. |
| 9,805,910 | B1 | 10/2017 | Trease et al. |
| 2004/0026633 | A1 | 2/2004 | Gunji et al. |
| 2005/0094862 | A1* | 5/2005 | Shimura .......... G01N 21/95607 382/141 |
| 2008/0099675 | A1* | 5/2008 | Hiroi ...................... G06T 7/001 250/307 |
| 2010/0051804 | A1 | 3/2010 | Adamec |
| 2010/0327160 | A1* | 12/2010 | Zhao ...................... H01J 37/28 250/307 |
| 2012/0062269 | A1 | 3/2012 | Patterson |
| 2014/0061462 | A1 | 3/2014 | Park et al. |
| 2014/0354799 | A1 | 12/2014 | Ojima et al. |
| 2016/0148781 | A1 | 5/2016 | Tsuno et al. |
| 2018/0053295 | A1 | 2/2018 | Ryu et al. |

* cited by examiner

TIME-DEPENDENT DEFECT INSPECTION APPARATUS

CROSS-REFERENCE TO RELATED APPLICATIONS

This application claims priority of U.S. application 62/723,995 which was filed on Aug. 28, 2018, and which is incorporated herein in its entirety by reference.

FIELD

The embodiments provided herein disclose a particle beam inspection apparatus, and more particularly, a particle beam inspection apparatus including an improved detection unit.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the wafer. By scanning the probe spot over the sample surface and collecting the secondary electrons, pattern inspection tools may obtain an image of the sample surface.

SUMMARY

The embodiments provided herein disclose a charged particle beam system for inspecting a wafer, and more particularly, a particle beam system including an improved detection unit.

In some embodiments, the charged particle beam system for inspecting a wafer comprises a charged particle beam source that includes circuitry to direct charged particles to one or more areas of the wafer over one or more time sequences. The charged particle beam system further comprises a controller that includes circuitry to produce a first set of images of a first area of the one or more areas during a first time sequence of the one or more time sequences. The controller also includes circuitry to process the first set of images to detect a defect in a thin device structure in the wafer.

In some embodiments, a method of inspecting a wafer is provided. The method uses a charged particle beam system with a charged particle beam source to direct charged particles onto one or more areas of the wafer over one or more time sequences. The method includes producing a first set of images of a first area of the one or more areas during a first time sequence of the one or more time sequences. The method further includes processing the first set of images to detect a defect in a thin device structure in the wafer.

In some embodiments, a non-transitory computer readable medium storing a set of instructions that is executable by a processor of a charged particle beam system is provided. The instructions cause the charged particle beam system, with a charged particle beam source to direct charged particles onto one or more areas of the wafer over one or more time sequences, to perform a method. The method includes producing a first set of images of a first area of the one or more areas during a first time sequence of the one or more time sequences. The method further includes processing the first set of images to detect a defect in a thin device structure in the wafer.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
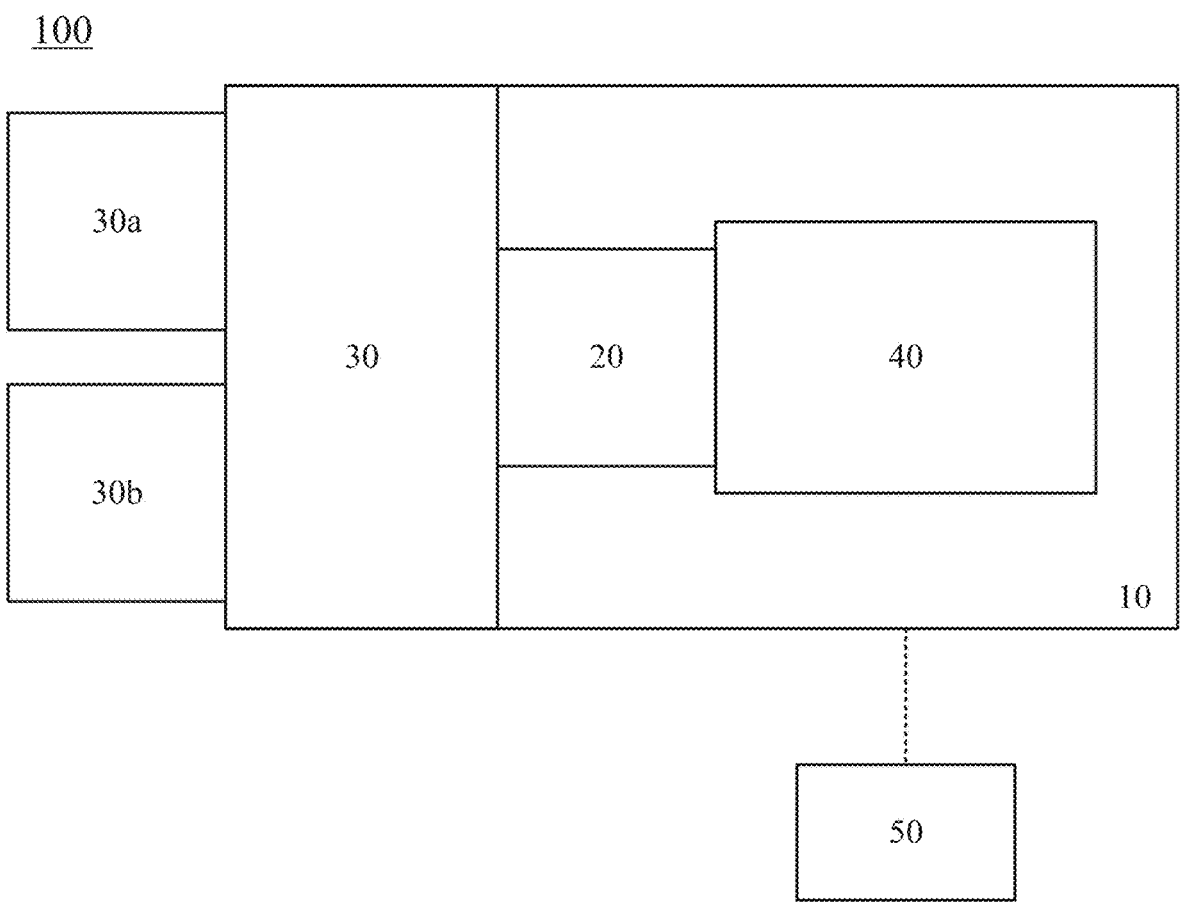
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, maintaining a high wafer throughput, defined as the number of wafers processed per hour, is also essential. High process yields and high wafer throughput can be impacted by the presence of defects, especially if operator intervention is required for reviewing the defects. Thus, high throughput detection and identification of micro and nano-sized defects by inspection tools (such as a SEM) is essential for maintaining high yields and low cost.

A SEM scans the surface of a wafer with a focused beam of electrons. The electrons interact with the wafer and generate secondary electrons. By scanning the wafer with an electron beam and capturing the secondary electrons with a detector, a SEM creates an image of the wafer that shows the internal device structure under the area of the wafer being inspected.

A conventional SEM inspection tool obtains a single image of an area of a wafer and compares the obtained image against a reference image that represents the corresponding device structures absent any defect. A difference detected from the comparison of the images may indicate a defect in the area of the wafer under inspection.

However, such a conventional inspection technique, e.g. capturing only a single image at an arbitrary point of time, may not be useful to identify a defect in a thin device structure, because the electrical characteristics of the defective thin structure changes over time. For example, even if a defect actually exists in the wafer under inspection, due to such a time-dependent behavior of a thin structure, sometimes the single obtained image may be captured at the right moment and show a difference from the reference image, but other times the obtained image may fail to show any difference at all. Therefore, a conventional SEM inspection tool cannot reliably identify a defect in a thin device structure.

One aspect of the present disclosure includes an improved inspection tool that can reliably detect a thin device defect that displays the above-described time-dependent behavior. For example, the improved inspection tool may obtain multiple images from the same area of the wafer over a time sequence. By comparing the multiple images of the same location (with those images being sampled at different times), the improved inspection tool can detect any change of the electric characteristics caused by a thin device defect within the area of the wafer.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single beam electron inspection tool. In other embodiments, electron beam tool 40 may comprise a multi-beam electron inspection tool.

A controller 50 is electronically connected to electron beam tool 40. Controller 50 may be a computer configured to execute various controls of charged particle beam inspection system 100. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
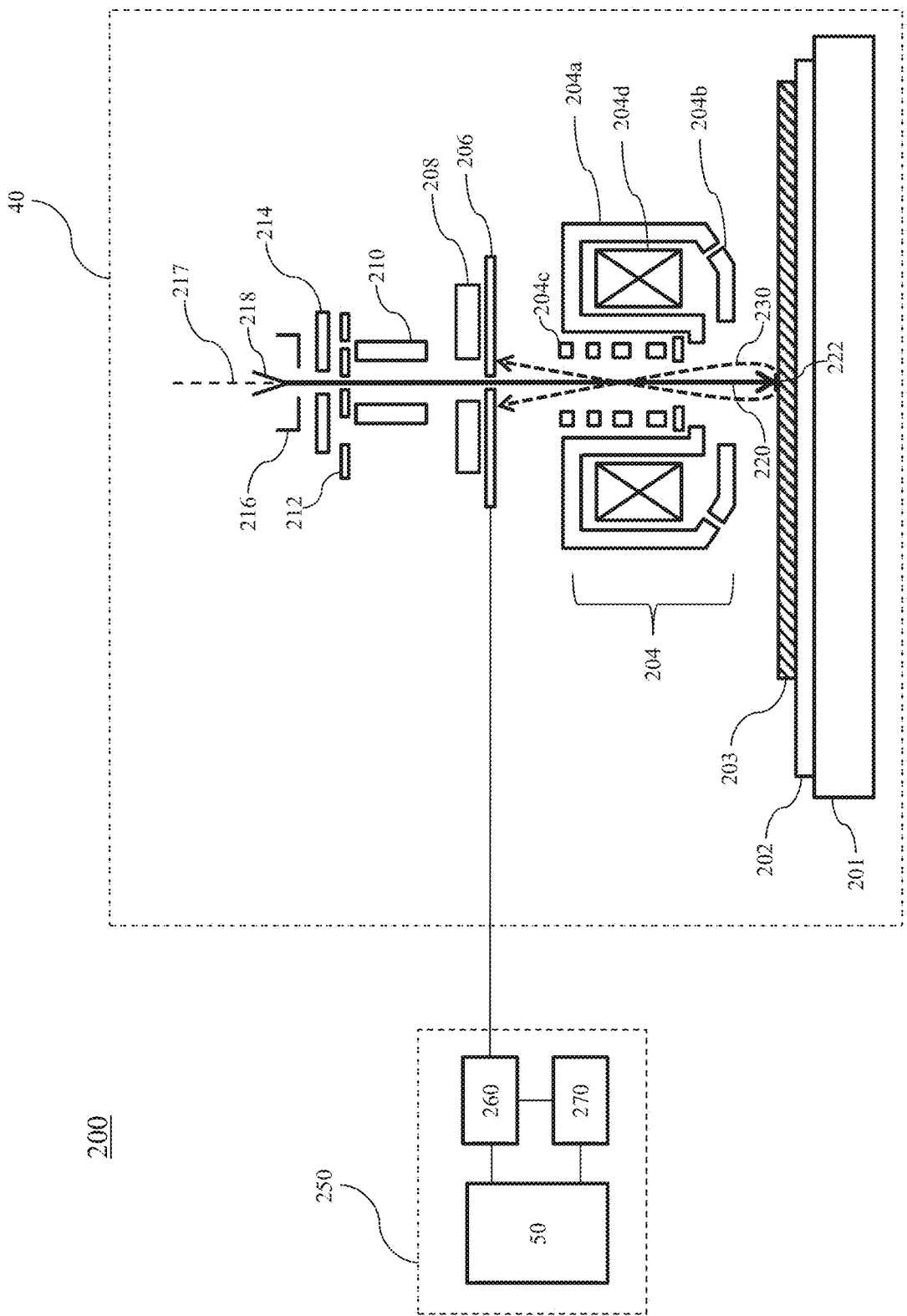
FIG. 2 is a schematic diagram illustrating an exemplary electron beam tool, consistent with embodiments of the present disclosure.

Reference is now made to FIG. 2, which is a schematic diagram illustrating an exemplary imaging system 200, comprising an electron beam tool 40 and an image processing system 250, consistent with embodiments of the present disclosure.

As shown in FIG. 2, electron beam tool 40 may include a motorized stage 201, and a wafer holder 202 supported by motorized stage 201 to hold a wafer 203 to be inspected. Electron beam tool 40 may further include a compound objective lens 204, electron detector 206 (which includes electron sensor surfaces), an objective aperture 208, a condenser lens 210, a beam limit aperture 212, a gun aperture 214, an anode 216, and a cathode 218, one or more of which may be aligned with an optical axis 217 of electron beam tool 40. In some embodiments, detector 206 may be arranged off axis 217.

Compound objective lens 204, in some embodiments, may include a modified swing objective retarding immersion lens (SORIL), which may include a pole piece 204a, a control electrode 204b, a deflector or a set of deflectors 204c, and an exciting coil 204d. Electron beam tool 40 may additionally include an energy dispersive X-ray spectrometer (EDS) detector (not shown) to characterize the materials on the wafer.

A primary electron beam 220 may be emitted from cathode 218 by applying a voltage between anode 216 and cathode 218. Primary electron beam 220 may pass through gun aperture 214 and beam limit aperture 212, both of which may determine the current of electron beam entering condenser lens 210, which resides below beam limit aperture 212. Condenser lens 210 may focus primary electron beam 220 before the beam enters objective aperture 208 to set the current of the electron beam before entering compound objective lens 204.

Compound objective lens 204 may focus primary electron beam 220 onto wafer 203 for inspection and can form a probe spot 222 on surface of wafer 203. Deflector(s) 204c may deflect primary electron beam 220 to scan probe spot 222 over wafer 203. For example, in a scanning process, deflector(s) 204c may be controlled to deflect primary electron beam 220 sequentially onto different locations of top surface of wafer 203 at different time points, to provide data for image reconstruction for different parts of wafer 203. Moreover, in some embodiments, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 40 may include a plurality of deflectors 204c to project the multiple primary electron beams 220 to different parts/sides of wafer 203 at the same time.

When a current is applied onto exciting coil 204d, an axially-symmetric (i.e., symmetric around optical axis 217) magnetic field may be generated in the wafer surface area. A part of wafer 203 being scanned by primary electron beam 220 may be immersed in the magnetic field. In some embodiments, different voltages may be applied onto wafer 203, pole piece 204a, and control electrode 204b, to generate an axial symmetric retarding electric field near the wafer surface. The electric field may reduce the energy of impinging primary electron beam 220 near the surface of the wafer before electrons of the beam collide with wafer 203. Control electrode 204b, being electrically isolated from pole piece 204a, may control an axially-symmetric electric field on the wafer to prevent micro-arcing of the wafer and to ensure proper beam focus at the wafer surface with the axially-symmetric magnetic field together.

A secondary electron beam 230 may be emitted from the part of wafer 203 upon receiving primary electron beam 220. Secondary electron beam 230 may comprise backscattered electrons, secondary electrons, or Auger electrons, resulting from the interactions of the primary electrons with wafer 203. Secondary electron beam 230 may be received by sensor surfaces of electron detector 206. In some embodiments, electron detector 206 may generate a signal (e.g., a voltage, a current, etc.) that represents an intensity of secondary electron beam 230 and may provide the signal to image processing system 250 in communication with electron detector 206. The intensity of secondary electron beam 230 may vary according to the external or internal structure of wafer 203, and thus may indicate whether wafer 203 includes defects. Moreover, as discussed above, primary electron beam 220 may be projected onto different locations of the top surface of wafer 203, or different sides of wafer 203 at a particular location, to generate secondary electron beams 230 of different intensities. Therefore, by mapping the intensity of secondary electron beam 230 with the areas of wafer 203, image processing system 250 may reconstruct an image that reflects the characteristics of internal or external structures of wafer 203.

In some embodiments, imaging system 200 may also comprise image processing system 250 that includes an image acquirer 260, a storage 270, and controller 50. Image acquirer 260 may comprise one or more processors. For example, image acquirer 260 may comprise a computer, server, mainframe host, terminals, personal computer, any kind of mobile computing devices, and the like, or a combination thereof. Image acquirer 260 may be communicatively coupled to a detector 206 of electron beam tool 40 through a medium such as an electrical conductor, optical fiber cable, portable storage media, IR, Bluetooth, internet, wireless network, wireless radio, or a combination thereof. In some embodiments, image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may be configured to perform adjustments of brightness and contrast, etc. of acquired images. In some embodiments, storage 270 may be a storage medium such as a hard disk, flash drive, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 50. In some embodiments, image acquirer 260, storage 270, and controller 50 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image comprising a plurality of imaging areas. The single image may be stored in storage 270. The single image may be an original image that may be divided into a plurality of regions. Each of the regions may comprise one imaging area containing a feature of wafer 203. The acquired images may comprise multiple images of a single imaging area of wafer 203 sampled multiple times over a time sequence. The multiple images may be stored in storage 270. In some embodiments, image processing system 250 may be configured to perform image processing steps with the multiple images of the same location of wafer 203.

In some embodiments, image processing system 250 may include measurement circuitries (e.g., analog-to-digital converters) to obtain a distribution of the detected secondary electrons. The electron distribution data collected during a detection time window, in combination with corresponding scan path data of primary electron beam 220 incident on the wafer surface, can be used to reconstruct images of the wafer structures under inspection. The reconstructed images can be used to reveal various features of the internal or external structures of wafer 203, and thereby can be used to reveal any defects that may exist in the wafer.

Moreover, although FIG. 2 shows that electron beam tool 40 uses a single primary electron beam, it is appreciated that electron beam tool 40 may also be a multi-beam inspection tool that uses multiple primary electron beams. The present disclosure does not limit the number of primary electron beams used in electron beam tool 40.

Figure 3:
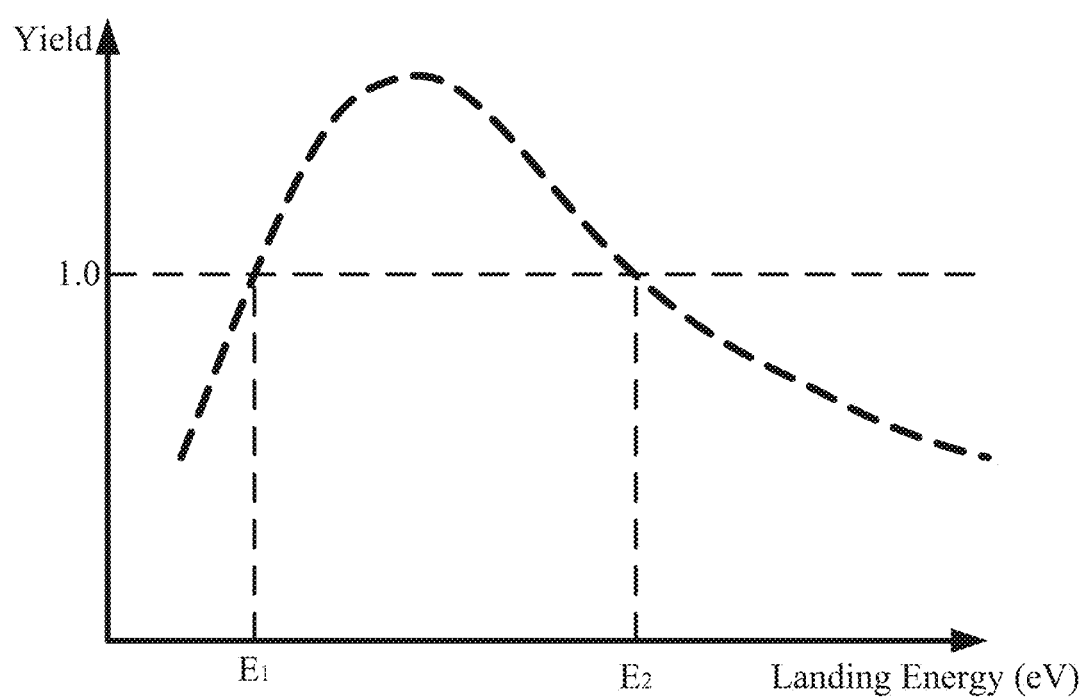
FIG. 3 is an exemplary graph showing a yield of secondary electrons relative to landing energy of primary electrons.

Reference is now made to FIG. 3, which is an exemplary graph showing a yield rate of secondary electrons relative to landing energy of primary electrons. The graph illustrates the relationship of the landing energy of a primary electron beam (such as primary electron beam 220 of FIG. 2) and the yield rate of secondary electron beams (such as secondary electron beams 230 of FIG. 2). The yield rate indicates how many secondary electrons are produced in response to the impact of the primary electrons. For example, the yield rate of higher than 1.0 indicates that a larger amount of secondary electrons may be produced than the amount of primary electrons that have landed on the wafer. Similarly, the yield rate of lower than 1.0 indicates that a lesser amount of secondary electrons may be produced in response to the impact of the primary electrons.

As shown in the graph of FIG. 3, when the landing energy of the primary electrons is within a range from $E_1$ to $E_2$, more electrons may leave the surface of the wafer than have landed onto the surface, therefore resulting in a positive electrical potential at the surface of the wafer. In some embodiments, defect inspection may be performed in the foregoing range of landing energies, which is called "positive mode." As described in further detail with respect to FIG. 4, a device structure with more positive surface potential may produce a darker voltage contrast image because a detector (such as detector 206 of FIG. 2) may receive a lesser amount of secondary electrons.

When the landing energy is lower than $E_1$ or higher than $E_2$, a lesser amount of electrons may leave the surface, thereby resulting in a negative electrical potential at the surface. In some embodiments, a defect inspection may be performed in this range of the landing energy, which is called "negative mode." A device structure with more negative surface potential may produce a brighter voltage contrast image of a wafer.

In some embodiments, the landing energy of the primary electron beams may be controlled by the total bias between the electron gun and the wafer.

Figure 4:
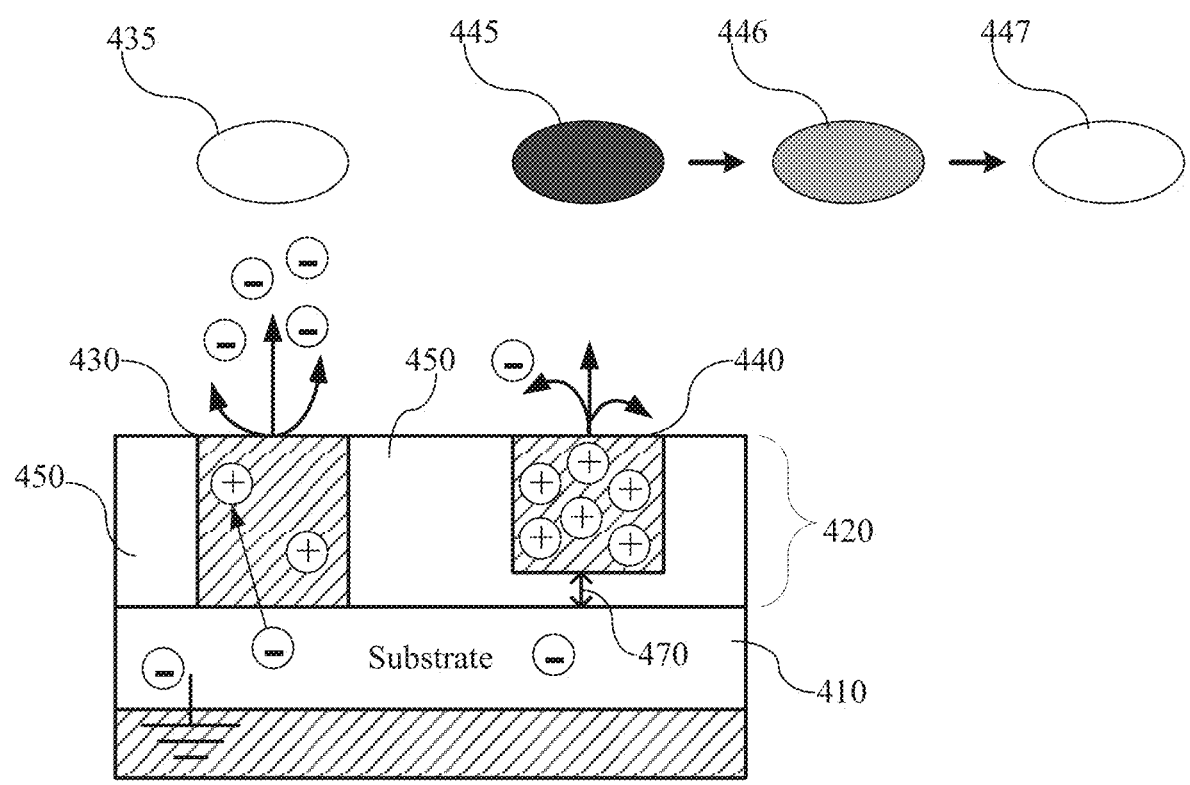
FIG. 4 is a schematic diagram of illustrating voltage-contrast response of a wafer, consistent with embodiments of the present disclosure.

Reference is now made to FIG. 4, which is a schematic diagram illustrating voltage contrast response of a device structure of a wafer, consistent with embodiments of the present disclosure. In some embodiments, physical and electrical defects on a wafer can be detected using a voltage contrast method of a charged particle inspection system. To detect a defect using voltage contrast images, typically a process called pre-charging is employed in which charged particles are applied onto an area to be inspected before conducting the inspection. Pre-charging may be useful to enhance voltage contrast type defect signals, for example as discussed in U.S. Pat. Nos. 8,748,815 and 8,759,762, which are herein incorporated by reference in their entirety.

For example, electron beam tools may be used to detect defects in internal or external structures of a wafer (such as wafer 203 of FIG. 2) based on the voltage contrast response of the wafer to illumination by the primary electron beams. In some embodiments, the wafer may comprise a test device 420 which is developed on top of a substrate 410. In some embodiments, test device 420 may include multiple device structures 430 and 440 separated by insulating material 450. For example, device structure 430 is connected to substrate 410. In contrast, device structure 440 is separated by insulating material 450 that creates a thin insulator structure 470 between device structure 440 and substrate 410 (e.g. thin oxide).

When an electron beam tool (such as electron beam tool 40 of FIG. 2) scans the surface of test device 420 with primary electrons (such as primary electron beam 220 of FIG. 2), secondary electrons (such as secondary electron beam 230 of FIG. 2) may be generated from the surface. As described earlier in FIG. 2, when the landing energy of the primary electrons is within a range from $E_1$ to $E_2$ (such that the yield rate is higher than 1.0), more electrons may leave the surface of the wafer than have landed on the surface, thereby resulting in a positive electrical potential at the surface of the wafer.

FIG. 4 illustrates how positive electrical potentials may be built-up at the surface of a wafer. For example, after an electron beam scans test device 420 (e.g. during pre-charging stage), device structure 440 may retain more positive charges because device structure 440 is not connected to an electrical ground in the substrate, thereby resulting in a positive potential at the surface of device structure 440. In contrast, although primary electrons with the same landing energy (thus, resulting in the same yield rate) have been applied, device structure 430 may retain less positive charges because the built-up positive charges may be neutralized by extra electrons supplied via the connection with substrate 410.

An image processing system (such as image processing system 250 of FIG. 2) may generate voltage contrast images 435 and 445 of the corresponding device structures 430 and 440, respectively. For example, device structure 430 is shorted to the ground and may not retain positive charges built-up during the pre-charging stage. As such, when the primary electron beams land on the surface of the wafer during the inspection stage, device structure 430 may repel more secondary electrons, thereby resulting in a brighter region on the voltage-contrast image. In contrast, device structure 440 has no connection to the substrate or any other grounds, and therefore may retain positive charges built-up during the pre-charging stage, which may cause device structure 440 to repel less secondary electrons during the inspection stage, thereby resulting in a darker region on the voltage-contrast image.

A conventional defect inspection tool uses electrons to build up the electrical potential on the surface of a wafer during the pre-charging stage. After pre-charging, the inspection tool obtains images of multiple dies within the wafer. Because all dies may comprise identical device structures, defects can be detected by comparing the voltage contrast differences of these images from multiple dies. For example, if the voltage contrast level of one of the images is lower or higher than the other images, the corresponding die can be determined to have a defect in the area of the die. A conventional inspection technique assumes that the electrical surface potential built-up during the pre-charging stage would be retained above the detection level of the tool throughout the inspection stage.

However, as the semiconductor process technology node shrinks (e.g. 10 nm, 7 nm, and lower), the built-up surface potential level may change during the inspection stage due to effects of electrical breakdown or tunneling, thereby resulting in the failure to detect the thin device defects. When a sufficiently high voltage is applied to a thin insulator structure (e.g. thin oxide), such as insulator structure 470, the leakage current can flow through the thin insulator structure and the thin insulator structure may not fully function as an insulator. This may affect the circuit functionality and result in a defect. The similar leakage current effect may also occur through a high resistance metal layer, for example a cobalt silicide (e.g. CoSi, $CoSi_2$, $Co_2Si$, $Co_3Si$, and such like) layer between a tungsten (W) plug and a source or drain area of a field-effect transistor (FET).

Insulator structure 470 may represent a thin defect susceptible to such a breakdown effect. For example, because of a manufacturing error, insulator structure 470 may have been defectively created in device structure 440 even though both device structures 430 and 440 are designed to make a contact with substrate 410 and function identically. A defective etching process may leave a thin oxide resulting an unwanted electrical blockage (e.g. open circuit) between two structures (e.g. device structure 440 and substrate 410) which were supposed to be electrically connected.

In such a case, if insulator structure 470 is sufficiently thick (e.g. thicker than 10 nm), the positive charges built-up in device structure 440 would not be leaked through insulator structure 470, therefore a conventional defect inspection tool may be able to detect the defect by taking one sample image during an inspection stage and comparing the image to a reference image. As a result, the voltage contrast difference between 435 and 445 may be detected, and thereby indicate a defect (e.g. insulator structure 470) in device structure 440.

However, as insulator structure 470 gets thinner (e.g. thinner than 10 nm), there is a higher chance that the built-up positive surface potential level in device structure 440 may decrease over time due to the above described leakage current. As device structure 440 loses positive charge, the voltage contrast level may also change over time from darker (e.g. image 445) to lighter (e.g. image 446), and eventually the inspection tool may fail to detect anything because the voltage contrast level is lower than the threshold of the detector (e.g. image 447). As a result, by the time the inspection stage begins and the inspection tool starts sampling the voltage contrast images, the built-up positive potential in device structure 440 may all disappear due to the leakage current through the thin insulator structure 470, thereby resulting in no difference in the surface potential between device structure 430 and 440. In such a case, the conventional defect inspection tool may fail to detect the thin device defect reliably if the inspection tool samples an image after the positive charges all disappear. For example, the inspection tool may fail to detect any difference between voltage contrast image 435 (from device structure 430) and voltage contrast image 447 (from device structure 440).

Therefore, to detect thin device defects susceptible to the time-dependent change of the built-up surface potential described above, an inspection tool may sample multiple images of the wafer over one or more time sequences while gradually increasing the surface potential, so that the time-dependent change may be captured by the sequence of multiple images. Additionally, in some embodiments, the inspection tool may use low energy primary electrons to gradually charge the wafer without inducing such a breakdown effect during the pre-charging stage. In other embodiments, the inspection tool may sample and produce voltage contrast images while pre-charging is in progress, so that a transient voltage contrast change can be captured even during the pre-charging stage.

The foregoing description has described the existence of short circuit conditions resulting in the corresponding features appearing bright, and the existence of open circuit conditions resulting in the corresponding features appearing dark. However, it is appreciated to those skilled in the art that the bright and dark appearance may be changed and even reversed depending on the actual processing of the test structures or the setting of the electron beam tool.

Figure 5A:
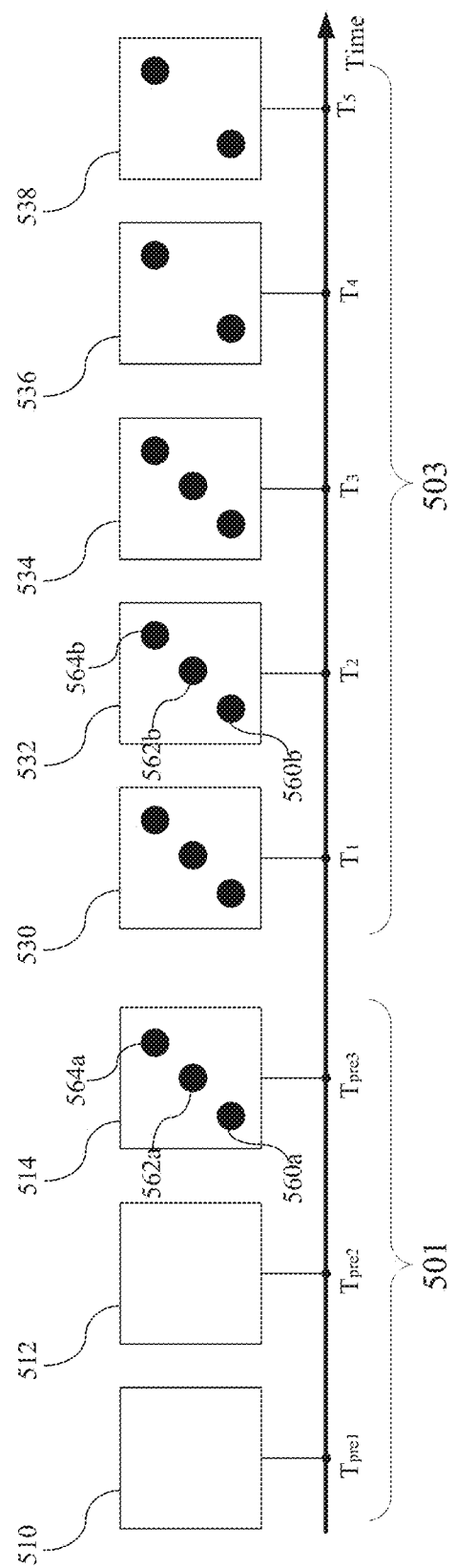
FIGS. 5A and 5B are illustrations of exemplary voltage contrast images over a time sequence, consistent with embodiments of the present disclosure.

Reference is now made to FIG. 5A, which is an illustration of exemplary voltage contrast images over a time sequence, consistent with embodiments of the present disclosure. In some embodiments, a defect inspection process may include a pre-charging stage 501 and an inspection stage 503. During pre-charging stage 501, an imaging system (such as imaging system 200 in FIG. 2) uses electrons to build up the electrical potential on the surface of a wafer. As explained above, to detect a thin device defect, the imaging system may use low energy electrons to gradually build up the electrical surface potential without inducing a breakdown or tunneling while pre-charging is underway. During inspection stage 503, in some embodiments, the imaging system may sample multiple images of a location area of a wafer (such as wafer 203 in FIG. 2) over a time sequence. By comparing the multiple voltage contrast images of the same location but from different times, the system may detect a change of the electrical surface potential over time, which indicates a device breakdown or tunneling effect due to a thin device defect.

For example, as shown in FIG. 5A, at the beginning of pre-charging stage 501, the surface potential may not be high enough to show any detectable voltage contrast regions, as shown in voltage contrast images 510 and 512. At the end of the pre-charging stage, dark voltage contrast (DVC) regions 560a, 562a, and 564a may start appearing (e.g. at time at time $T_{pre3}$).

In some embodiments, during pre-charging stage 501, an electron beam tool (such as electron beam tool 40 in FIG. 2) may use primary electrons with lower energy than the conventional system to avoid a device breakdown during the pre-charging stage (e.g. before the sampling of voltage contrast images begins), as explained above.

In other embodiments, the electron beam tool may skip pre-charging stage 501 and begin the inspection process with inspection stage 503 to detect a thin device structure defect. In such embodiments, the electron beam tool may begin sampling images as soon as the inspection process is initiated. Because there is no pre-charging of the electrical potential at the surface of the wafer, the primary beam scanning for image production may be used to gradually build electrical charges at the surface of the wafer while continuously sampling images.

After the pre-charging is completed, the electron beam tool may start sampling images from an area of the wafer multiple times over a time sequence. For example, as shown in FIG. 5A, multiple images 530, 532, 534, 536, and 538 are sampled during the inspection stage at time $T_1$, $T_2$, $T_3$, $T_4$, and $T_5$, respectively.

At time $T_1$, image 530 shows that three DVC regions 560a, 562a, and 564a are present. DVC regions 560b, 562b, and 564b may represent the electrical surface potential built-up in three device structures (such as device structure 440 of FIG. 4). At time $T_2$ and $T_3$, image 532 and 534 show that DVC regions 560b, 562b, and 564b are detected again, which may indicate that the built-up positive charges are remained in the device structure and unchanged from time $T_1$.

At time $T_4$, image 536 shows that DVC region 562b disappears while DVC regions 560b and 564b are still present. This may indicate that the corresponding device structure for DVC region 562b may have lost the built-up positive charges due to the leakage current, thereby resulting in the surface potential dropping down to a non-detectable level (e.g. breakdown effect). When a high voltage is applied to a thin structure (e.g. insulator structure 470 of FIG. 4), leakage current may flow through the thin structure even if the structure is made of an insulating material. The rate of the leakage current is higher when the device structure is thinner. For example, the device breakdown may occur more frequently if the thickness of device structure is, e.g., less than 10 nm. Therefore, the positive charge built-up at the corresponding device structure for DVC region 562b may have been neutralized because of the device breakdown through the thin device structure defect.

Figure 5B:
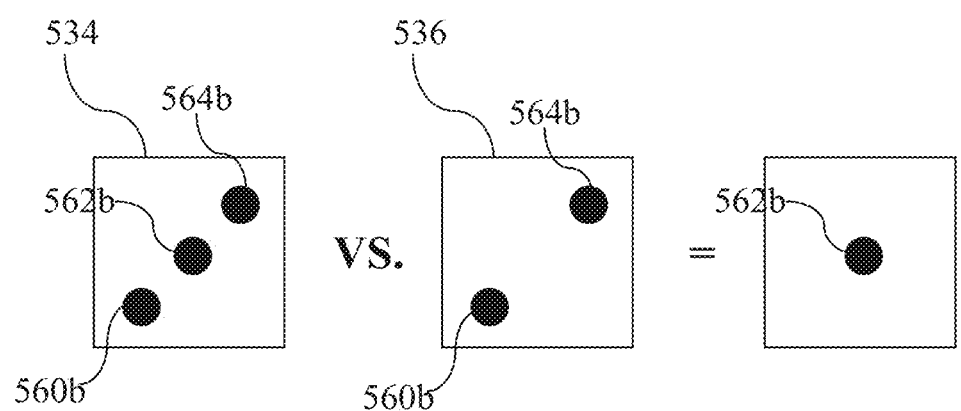

In some embodiments, a thin device structure defect may be identified by detecting this transient effect on the surface potential. For example, an electron beam tool may compare multiple images of the same location, e.g. images 530, 532, 534, 536, and 538, and detect the changes of DVC regions over a time sequence to identify a thin device structure defect. In some embodiments, by comparing the multiple voltage contrast images of the same location but from different times, the system may detect a change of the electrical surface potential over time, which indicates a device breakdown due to a thin device defect. For example, as shown in FIG. 5B, voltage contrast image 534 (sampled at time $T_3$) and 536 (sampled at time $T_4$) show that DVC region 562b has disappeared between time $T_3$ and $T_4$, and thereby may indicate that the corresponding device structure may comprise a thin device structure defect.

Although FIG. 5A illustrates an example with five images, it is appreciated that two or more images may be used to detect the thin device structure defect. Furthermore, although images shown in FIGS. 5A and 5B illustrate the detection mechanism using the dark voltage contrast, it is appreciated that the bright voltage contrast may also be used when the electron beam tool operates in the negative mode.

In some embodiments, the time interval between the sampling time $T_1$, $T_2$, $T_3$, $T_4$, and $T_5$ may be adjusted to capture different timing of the transient effect on the voltage contrast images. The timing may depend on the amount of current supplied during the pre-charging phase or on the characteristics of the thin device structure defect, such as the thickness of the structure, the rate of electron movement through the structure due to the breakdown, etc.

In some embodiments, a positive surface potential may be built up because the electron beam tool operates in the positive mode (e.g. $E_1$<Landing Energy<$E_2$). In other embodiments, a negative potential may be built up because the electron beam tool operates in the negative mode (e.g. Landing Energy<$E_1$ or Landing Energy>$E_2$).

Figure 6:
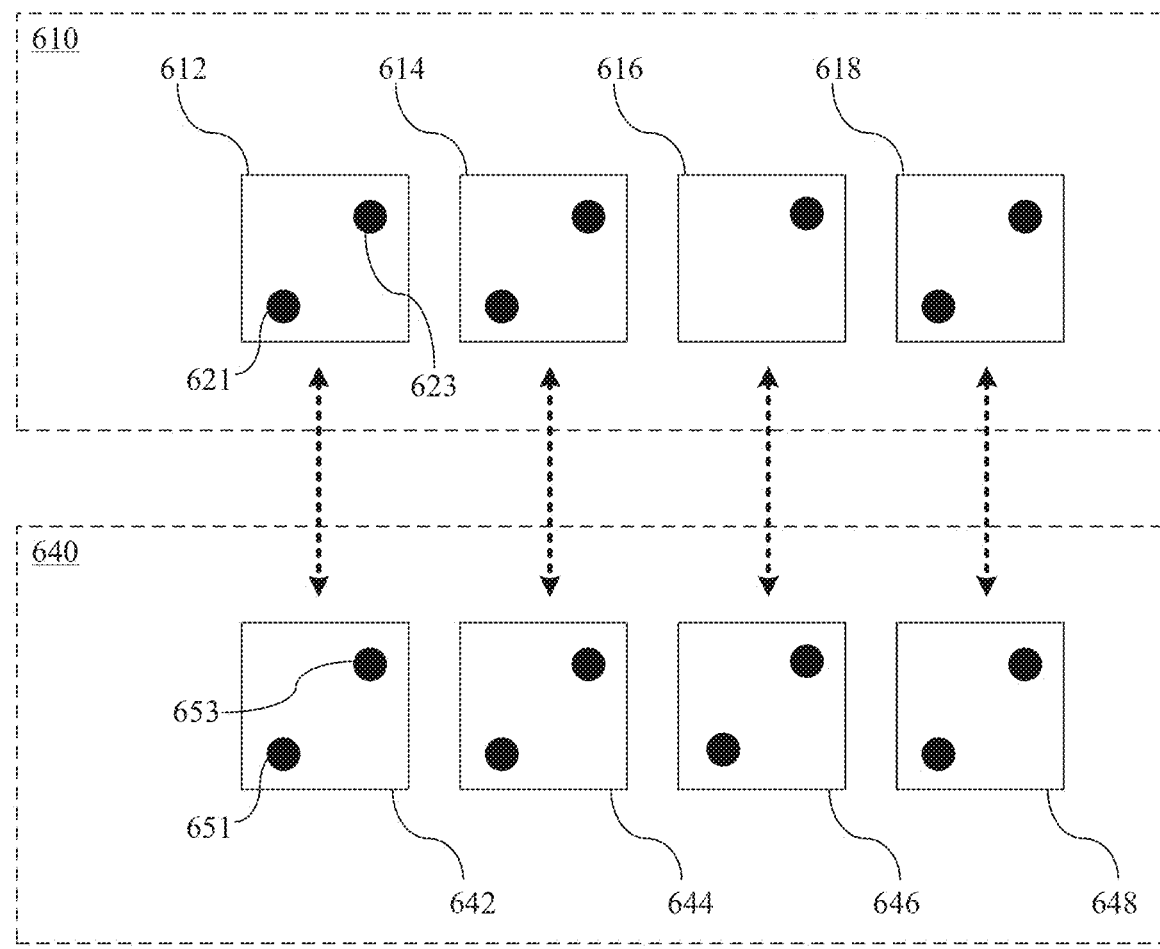
FIG. 6 is an illustration of exemplary processing of voltage contrast images, consistent with embodiments of the present disclosure.

Reference is now made to FIG. 6, which is an illustration of exemplary processing of voltage contrast images, consistent with embodiments of the present disclosure. In some embodiments, an inspection tool (such as imaging system 200 in FIG. 2) may compare a set of voltage contrast images to another set of voltage contrast images. For example, the inspection tool may produce a first set of voltage contrast images 610 and a second set of voltage contrast images 640, and then compare the corresponding images from each set one by one (e.g. 612 vs. 642, 614 vs. 644, 616 vs. 646, 618 vs. 648) to detect a time-dependent defect caused by a breakdown at a thin device structure. In some embodiments, both sets of voltage contrast images, 610 and 640, may be sampled from the same location of the wafer, but over two different time sequences. In other embodiments, the first set of voltage contrast images 610 may be sampled from a first location of the wafer while the second set of voltage contrast images 640 is sampled from a second location of the wafer, wherein the first location and the second location of the wafer may comprise identical device structures.

As shown in FIG. 6, the first set of voltage contrast images 610 illustrate that DVC region 621 may temporarily disappear (as on image 616) and reappear (as on image 618). Disappearing may be due to a breakdown caused by the leakage current through a thin device structure. After breakdown, a positive surface potential may be built-up again because of the subsequent scans of primary particle beams for inspection, thereby resulting in that DVC region 621 may reappear as shown on image 618. The inspection tool may detect the transient changes of DVC region 621 by comparing voltage contrast image 616 to voltage contrast image 646. Because both sets of images (610 and 640) represent the same device structures (either from the same location or from different locations with same device structures), the difference between image 616 and 646 may indicate a thin device defect at the location of the wafer.

Figure 7:
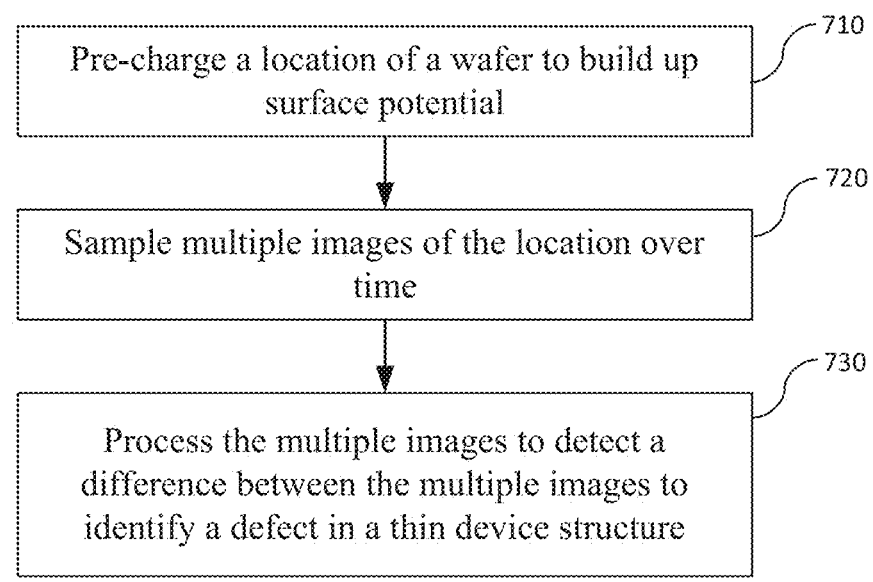
FIG. 7 is a flow chart illustrating an exemplary method for detecting a time-dependent defect, consistent with embodiments of the present disclosure.

Reference is now made to FIG. 7, which is a flow chart illustrating an exemplary method for detecting a time-dependent defect, consistent with embodiments of the present disclosure. The method may be performed by an imaging system (such as imaging system 200 of FIG. 2).

In step 710, an electron beam tool (such as electron beam tool 40 of FIG. 2) pre-charges the wafer under inspection to build up an electrical potential on the surface of the wafer. When the electron beam tool scans the surface of a wafer with primary electrons (such as primary electron beam 220 of FIG. 2), secondary electrons (such as secondary electron beams 230 of FIG. 2) may be generated from the surface. As described earlier in FIG. 2, when the landing energy of the primary electrons is within a range from $E_1$ to $E_2$ (such that the yield rate is higher than 1.0), more electrons may leave the surface of the wafer than have landed onto the surface, thereby resulting in the positive electrical potential at the surface of the wafer.

If an insulator structure (such as insulator structure 470 of FIG. 4) is sufficiently thick (e.g., thicker than 10 nm), the positive charges built-up in a device structure (such as device structure 440 of FIG. 4) would not be leaked through the insulator structure, therefore a conventional defect inspection tool may detect the defect by taking one sample image during an inspection stage. As a result, the voltage contrast difference between a defective structure and non-defective structure may be detected.

However, as the device structure gets thinner (e.g. thinner than 10 nm), there may be a high chance that the built-up surface potential level may change during the inspection stage due to an electrical breakdown or a tunneling effect. As a result, by the time the inspection stage begins and the inspection tool starts sampling the voltage contrast images, the built-up positive potential in the device structure may all disappear through the thin insulator structure due to a breakdown or other thin film related mechanism, thereby resulting in no difference in the surface potential between defective and non-defective device structures, or a difference lower than a detection threshold. Resultantly, the conventional defect inspection tool may fail to detect the thin device defect. Therefore, the imaging system may use low energy primary electrons to gradually charge the wafer to avoid causing a breakdown that results in the loss of the electrical surface potential during the pre-charging stage.

In step 720, after the wafer is pre-charged, the electron beam tool samples multiple voltage contrast images (e.g, images 530, 532, 534, 536, and 538 of FIG. 5A) from the same location area of the wafer at different times (e.g. sampling time $T_1$, $T_2$, $T_3$, $T_4$, and $T_5$ of FIG. 5A). To detect the time-dependent change of the electrical surface potential, in some embodiments, the inspection tool may sample images from the same location area of the wafer multiple times over a time sequence while gradually increasing the surface potential.

In step 730, an image processing system (such as image processing system 250 of FIG. 2) processes the multiple voltage contrast images and detects a dark voltage contrast (DVC) difference between the multiple images to identify a defect in a thin device structure. In some embodiments, by comparing the multiple voltage contrast images of the same location but from different times, the system may detect a change of the electrical surface potential over time, which indicates a device breakdown due to a thin device defect. For example, as shown in FIG. 5B, voltage contrast image 534 (sampled at time $T_3$) and 536 (sampled at time $T_4$) show that DVC region 562b has disappeared between time $T_3$ and $T_4$, and thereby may indicate that the corresponding device structure may comprise a thin device structure defect. In some embodiments, a bright voltage contrast difference may be detected.

The embodiments may further be described using the following clauses:

1. A charged particle beam system for inspecting a wafer, comprising:
    a charged particle beam source including circuitry to direct charged particles to one or more areas of the wafer over one or more time sequences; and
    a controller including circuitry to:
        produce a first set of images of a first area of the one or more areas during a first time sequence of the one or more time sequences; and
        process the first set of images to detect a defect in a thin device structure in the wafer.
2. The system of clause 1, wherein the controller includes circuitry to:
    sample a first image and a second image from the first set of images, wherein the first image is sampled at a first time of the first time sequence and the second image is sampled at a second time of the first time sequence; and
    compare the first image to the second image to identify the defect at the first area of the one or more areas of the wafer.
3. The system of clause 1, wherein the controller includes circuitry to:
    produce a second set of images of the first area of the one or more areas during a second time sequence of the one or more time sequences;
    sample a first image from the first set of images and a second image from the second set of images; and
    compare the first image to the second image to identify the defect at the first area of the one or more areas of the wafer.
4. The system of clause 1, wherein the controller includes circuitry to:
    produce a second set of images of a second area of the one or more areas during a second time sequence of the one or more time sequences, wherein the first area and the second area comprise same device structures;
    sample a first image from the first set of images and a second image from the second set of images; and
    compare the first image to the second image to identify the defect at the first area or the second area of the one or more areas of the wafer.
5. The system of any one of clauses 3 and 4, wherein the first image and the second image are sampled at corresponding times of the first time sequence and the second time sequence.
6. The system of any one of clauses 2 to 5, wherein the first image and the second image comprise voltage contrast levels.
7. The system of clause 6, wherein the controller includes circuitry to detect a difference between the voltage contrast levels of the first image and the voltage contrast levels of the second image to identify a defect in the thin device structure.
8. The system of any one of clauses 1 to 7, wherein the charged particle beam source includes circuitry to:
    pre-scan the one or more areas of the wafer during a first part of the one or more time sequences; and
    inspect the one or more areas of the wafer during a second part of the one or more time sequences.
9. The system of clause 8, wherein the charged particle beam source includes circuitry to build up one or more surface potentials at the one or more areas of the wafer while performing the pre-scan during the first part of the one or more time sequences.
10. The system of clause 9, wherein the charged particle beam source performs the pre-scan until a device breakdown occur.
11. The system of any one of clauses 1 to 10, wherein the controller includes circuitry to adjust a time interval between the production of each image in the first set of images.
12. The system of any one of clauses 2 to 10, wherein the controller includes circuitry to adjust a time interval between the production of each image in the second set of images.
13. The system of any one of clauses 1 to 12, wherein the defect comprises an electrical defect associated with an electrical leakage in the thin device structure at the area.
14. The system of clause 13, wherein the thin device structure comprises a thin oxide that remains after an etching process.
15. The system of any one of clauses 1 to 14, further comprising:
    a detector, communicatively coupled to the controller, configured to produce detection data based on a detection of secondary charged particles associated with the charged particles impacting the one or more areas of the wafer.
16. The system of clause 15, wherein the controller includes circuitry to construct corresponding voltage contrast images based on the detection data produced by the detector.
17. A method of inspecting a wafer using a charged particle beam system with a charged particle beam source to direct charged particles onto one or more areas of the wafer over one or more time sequences, the method comprising:
    producing a first set of images of a first area of the one or more areas during a first time sequence of the one or more time sequences; and
    processing the first set of images to detect a defect in a thin device structure in the wafer.
18. The method of clause 17, further comprising:
    sampling a first image and a second image from the first set of images, wherein the first image is sampled at a first time of the first time sequence and the second image is sampled at a second time of the first time sequence; and
comparing the first image to the second image to identify the defect at the first area of the one or more areas of the wafer.
19. The method of clause 17, further comprising:
producing a second set of images of the first area of the one or more areas during a second time sequence of the one or more time sequences;
sampling a first image from the first set of images and a second image from the second set of images; and
comparing the first image to the second image to identify the defect at the first area of the one or more areas of the wafer.
20. The method of clause 17, further comprising:
producing a second set of images of a second area of the one or more areas during a second time sequence of the one or more time sequences, wherein the first area and the second area comprise same device structures;
sampling a first image from the first set of images and a second image from the second set of images; and
comparing the first image to the second image to identify the defect at the first area or the second area of the one or more areas of the wafer.
21. The method of any one of clauses 19 and 20, the first image and the second image are sampled at corresponding times of the first time sequence and the second time sequence.
22. The method of any one of clauses 18 to 21, wherein the first image and the second image comprise voltage contrast levels.
23. The method of clause 22, further comprising detecting a difference between the voltage contrast levels of the first image and the voltage contrast levels of the second image to identify a defect in the thin device structure.
24. The method of any one of clauses 17 to 23, further comprising adjusting a time interval between the production of each image in the first set of images.
25. The method of any one of clauses 18 to 23, further comprising adjusting a time interval between the production of each image in the second set of images.
26. A non-transitory computer readable medium storing a set of instructions that is executable by a processor of a charged particle beam system to cause the charged particle beam system, with a charged particle beam source to direct charged particles onto one or more areas of the wafer over one or more time sequences, to perform a method comprising:
producing a first set of images of a first area of the one or more areas during a first time sequence of the one or more time sequences; and
processing the first set of images to detect a defect in a thin device structure in the wafer.
27. The computer readable medium of clause 26, wherein the set of instructions that is executable by the processor of the charged particle beam system to cause the charged particle beam system to further perform:
sampling a first image and a second image from the first set of images, wherein the first image is sampled at a first time of the first time sequence and the second image is sampled at a second time of the first time sequence; and
comparing the first image to the second image to identify the defect at the first area of the one or more areas of the wafer.

28. The computer readable medium of clause 26, wherein the set of instructions that is executable by the processor of the charged particle beam system to cause the charged particle beam system to further perform:
producing a second set of images of the first area of the one or more areas during a second time sequence of the one or more time sequences;
sampling a first image from the first set of images and a second image from the second set of images; and
comparing the first image to the second image to identify the defect at the first area of the one or more areas of the wafer.
29. The computer readable medium of clause 26, wherein the set of instructions that is executable by the processor of the charged particle beam system to cause the charged particle beam system to further perform:
producing a second set of images of a second area of the one or more areas during a second time sequence of the one or more time sequences, wherein the first area and the second area comprise same device structures;
sampling a first image from the first set of images and a second image from the second set of images; and
comparing the first image to the second image to identify the defect at the first area or the second area of the one or more areas of the wafer.
30. The computer readable medium of any one of clauses 28 and 29, wherein the set of instructions that is executable by the processor of the charged particle beam system to cause the charged particle beam system to perform the method, wherein the first image and the second image are sampled at corresponding times of the first time sequence and the second time sequence.
31. The computer readable medium of any one of clauses 27 to 30, wherein the set of instructions that is executable by the processor of the charged particle beam system to cause the charged particle beam system to perform the method, wherein the first image and the second image comprise voltage contrast levels.
32. The computer readable medium of clause 31, wherein the set of instructions that is executable by the processor of the charged particle beam system to cause the charged particle beam system to further perform:
detecting a difference between the voltage contrast levels of the first image and the voltage contrast levels of the second image to identify a defect in the thin device structure.
33. The computer readable medium of any one of clauses 26 to 32, wherein the set of instructions that is executable by the processor of the charged particle beam system to cause the charged particle beam system to further perform:
adjusting a time interval between the production of each image in the first set of images.
34. The computer readable medium of any one of clauses 27 to 32, wherein the set of instructions that is executable by the processor of the charged particle beam system to cause the charged particle beam system to further perform:
adjusting a time interval between the production of each image in the second set of images.

It is appreciated that the image processing system may use software to control the functionality described above. For example, the image processing system may receive a signal from a detector (such as detector 206 of FIG. 2) and reconstruct images of the wafer. Furthermore, the image processing system may perform image processing algorithm to adjust the brightness or contrast of the reconstructed images. The image processing system may also perform a control function to adjust a time interval between the sampled images. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing the spirit and scope of the subject matter as hereafter claimed.

What is claimed is:

1. A charged particle beam system for inspecting a wafer, comprising:
   a charged particle beam source including circuitry to direct charged particles to one or more areas of the wafer over one or more time sequences; and
   a controller including circuitry to:
      produce a first set of images of a first area of the one or more areas during a first time sequence of the one or more time sequences; and
      process the first set of images to detect a defect in a thin device structure in the wafer, wherein the controller includes circuitry to adjust a time interval between the production of each image in the first set of images.

2. The system of claim 1, wherein the controller includes circuitry to:
   sample a first image and a second image from the first set of images, wherein the first image is sampled at a first time of the first time sequence and the second image is sampled at a second time of the first time sequence; and
   compare the first image to the second image to identify the defect at the first area of the one or more areas of the wafer.

3. The system of claim 2, wherein the first image and the second image comprise voltage contrast levels.

4. The system of claim 3, wherein the controller includes circuitry to detect a difference between the voltage contrast levels of the first image and the voltage contrast levels of the second image to identify a defect in the thin device structure.

5. The system of claim 1, wherein the controller includes circuitry to:
   produce a second set of images of the first area of the one or more areas during a second time sequence of the one or more time sequences;
   sample a first image from the first set of images and a second image from the second set of images; and
   compare the first image to the second image to identify the defect at the first area of the one or more areas of the wafer.

6. The system of claim 5, wherein the first image and the second image are sampled at corresponding times of the first time sequence and a second time sequence.

7. The system of claim 5, wherein the controller includes circuitry to adjust a time interval between the production of each image in the second set of images.

8. The system of claim 1, wherein the controller includes circuitry to:
   produce a second set of images of a second area of the one or more areas during a second time sequence of the one or more-time sequences, wherein the first area and the second area comprise same device structures;
   sample a first image from the first set of images and a second image from the second set of images; and
   compare the first image to the second image to identify the defect at the first area or the second area of the one or more areas of the wafer.

9. The system of claim 1, wherein the charged particle beam source includes circuitry to:
   pre-scan the one or more areas of the wafer during a first part of the one or more time sequences; and
   inspect the one or more areas of the wafer during a second part of the one or more time sequences.

10. The system of claim 9, wherein the charged particle beam source includes circuitry to build up one or more surface potentials at the one or more areas of the wafer while performing the pre-scan during the first part of the one or more time sequences.

11. The system of claim 10, wherein the charged particle beam source performs the pre-scan until a device breakdown occur.

12. The system of claim 1, wherein the defect comprises an electrical defect associated with an electrical leakage in the thin device structure at the area.

13. The system of claim 12, wherein the thin device structure comprises a thin oxide that remains after an etching process.

14. A non-transitory computer readable medium storing a set of instructions that is executable by a processor of a charged particle beam system to cause the charged particle beam system, with a charged particle beam source to direct charged particles onto one or more areas of a wafer over one or more time sequences, to perform a method comprising:
   producing a first set of images of a first area of the one or more areas during a first time sequence of the one or more time sequences; and
   processing the first set of images to detect a defect in a thin device structure in the wafer, wherein the controller includes circuitry to adjust a time interval between the production of each image in the first set of images.

* * * * *